United States Patent
Barna et al.

(10) Patent No.: US 9,515,105 B2
(45) Date of Patent: Dec. 6, 2016

(54) DUAL PHOTODIODE IMAGE PIXELS WITH PREFERENTIAL BLOOMING PATH

(71) Applicant: SEMICONDUCTOR COMPONENTS INDUSTRIES, LLC, Phoenix, AZ (US)

(72) Inventors: Sandor Barna, Los Altos, CA (US); Richard Scott Johnson, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 18 days.

(21) Appl. No.: 14/624,917

(22) Filed: Feb. 18, 2015

(65) Prior Publication Data

US 2016/0240570 A1 Aug. 18, 2016

(51) Int. Cl.
*H01L 27/146* (2006.01)

(52) U.S. Cl.
CPC ... *H01L 27/14605* (2013.01); *H01L 27/14621* (2013.01); *H01L 27/14627* (2013.01); *H01L 27/14645* (2013.01); *H01L 27/14654* (2013.01)

(58) Field of Classification Search
CPC .......... H01L 27/14609; H01L 27/14689; H01L 27/14652; H01L 27/1463; H01L 27/14621; H01L 31/112; H01L 31/18; H04N 3/1568; H04N 3/1556; H04N 5/1525; H04N 5/2175; H04N 5/3591; H04N 5/3592; H04N 5/3595; H04N 5/359
USPC ........................................................ 348/302
See application file for complete search history.

(56) References Cited

U.S. PATENT DOCUMENTS

| | | | |
|---|---|---|---|
| 7,022,544 B2 | 4/2006 | Cohen et al. | |
| 7,161,220 B2 | 1/2007 | Cohen et al. | |
| 7,504,672 B1 | 3/2009 | Kinch | |
| 7,829,834 B2 | 11/2010 | Kim et al. | |
| 7,928,478 B2 | 4/2011 | Hynecek | |
| 8,471,313 B2 * | 6/2013 | Takahashi | H01L 27/14609 257/292 |
| 8,648,362 B2 * | 2/2014 | Nakamura | H01L 27/14607 257/89 |
| 8,709,852 B2 | 4/2014 | Hynecek | |
| 2009/0101914 A1 * | 4/2009 | Hirotsu | H01L 27/14609 257/72 |
| 2010/0117126 A1 * | 5/2010 | Takahashi | H01L 27/14609 257/292 |
| 2010/0314667 A1 | 12/2010 | Nozaki | |
| 2012/0242875 A1 * | 9/2012 | Nakamura | H01L 27/14607 348/294 |
| 2013/0175582 A1 * | 7/2013 | Ihara | H01L 27/1461 257/222 |

(Continued)

*Primary Examiner* — Pritham Prabhakher
(74) *Attorney, Agent, or Firm* — Treyz Law Group, P.C.; Jason Tsai

(57) ABSTRACT

An image sensor with an array of image sensor pixels is provided. Each image sensor pixel may include a set of photodiodes formed in a semiconductor substrate, a color filter structure formed over the set of photodiodes, a microlens formed over the color filter structure, and associated pixel circuitry coupled to the set of photodiodes. The set of photodiodes may include at least two photodiodes linked together via a preferential blooming channel that provides a reduced potential barrier between the two photodiodes. This allows excess charge to spill over from one photodiode to another when more charge is concentrated in a particular photodiode. Configured in this way, the pixel can provide depth sensing capabilities without suffering from reduced pixel capacity.

19 Claims, 5 Drawing Sheets

(56) References Cited

U.S. PATENT DOCUMENTS

2014/0253768 A1* 9/2014 Li ........................ H04N 5/335
348/294

* cited by examiner

DUAL PHOTODIODE IMAGE PIXELS WITH PREFERENTIAL BLOOMING PATH

BACKGROUND

This relates generally to image sensors, and more specifically, to image sensors with dual photodiode pixels.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include an array of image sensor pixels each of which includes a photodiode and other operational circuitry such as transistors formed in the substrate.

In an effort to enable focus detection, image sensor pixels each of which includes a pair of photodiodes have been developed. An array of microlenses is formed over the image sensor pixels, where each microlens in the array covers a respective pair of photodiodes in a corresponding pixel. A camera lens (sometimes referred to as a macrolens) is formed over the array of microlenses to help direct incoming light to the array of microlenses. When the camera lens is in focus, light will be distributed evenly to each of the two photodiodes in a pixel. When the camera lens is out of focus, however, light will be more concentrated in one of the two photodiodes in a pixel. Thus, during focus sensing operations, the amount of charge can be read independently from the two photodiodes and then compared to determine whether the camera lens is in or out of focus.

This arrangement may, however, be problematic during normal operation when the camera lens is not in focus. Consider, for example, a scenario in which incoming light is out of focus. In such scenarios, charge will predominately accumulate in one of the two photodiodes in a given pixel. When this photodiode becomes full, that photodiode will no longer be sensitive to additional light, and the corresponding output signal will no longer be valid (i.e., the pixel is "saturated"). As a result, the effective maximum pixel capacity will be limited by the storage capacity of each individual photodiode, even if the photodiodes are read out simultaneously and combined. This constraint in pixel capacity can severely limit the image quality of the sensor in bright lighting conditions.

It would therefore be desirable to be able to provide image sensors having dual photodiode pixels with improved pixel capacity.

DETAILED DESCRIPTION

Embodiments of the present invention relate to image sensors, and more particularly, to image sensors with dual photodiode imaging pixels. It will be recognized by one skilled in the art, that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices include image sensors that gather incoming light to capture an image. The image sensors may include arrays of imaging pixels. The pixels in the image sensors may include photosensitive elements such as photodiodes that convert the incoming light into image signals. Image sensors may have any number of pixels (e.g., hundreds or thousands of pixels or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
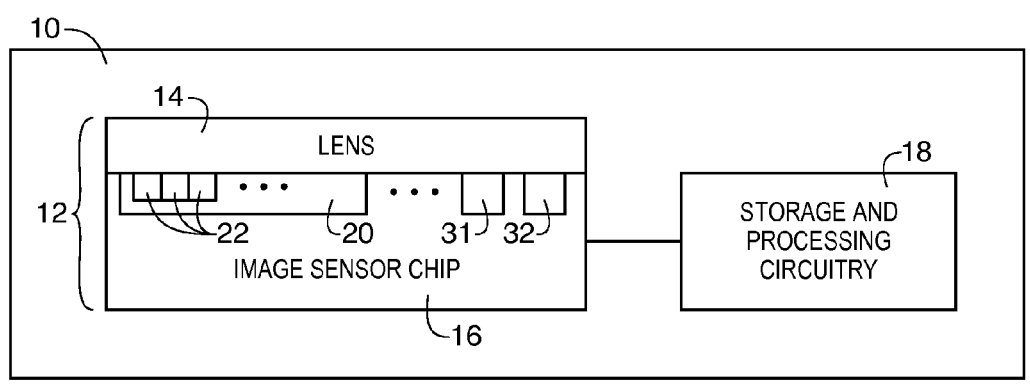
FIG. 1 is a diagram of an illustrative electronic device in accordance with an embodiment.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. Image sensor 16 may be an image sensor system-on-chip (SOC) having additional processing and control circuitry such as analog control circuitry 31 and digital control circuitry 32 on a common image sensor integrated circuit die with image pixel array 20 or on a separate companion die/chip.

During image capture operations, light from a scene may be focused onto an image pixel array (e.g., array 20 of image pixels 22) by lens 14. Image sensor 16 provides corresponding digital image data to analog circuitry 31. Analog circuitry 31 may provide processed image data to digital circuitry 32 for further processing. Circuitry 31 and/or 32 may also be used in controlling the operation of image sensor 16. Image sensor 16 may, for example, be a frontside illumination (FSI) image sensor or a backside illumination (BSI) image sensor. If desired, camera module 12 may be provided with an array of lenses 14 and an array of corresponding image sensors 16. Lens structures 14 may include at least one macrolens (sometimes referred to as a camera lens) for directing incoming light to a corresponding array of smaller microlenses each of which is formed over a respective image sensor pixel (see, e.g., pixels 22).

Device 10 may include additional control circuitry such as storage and processing circuitry 18. Circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be further processed and/or stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices.

Figure 2:
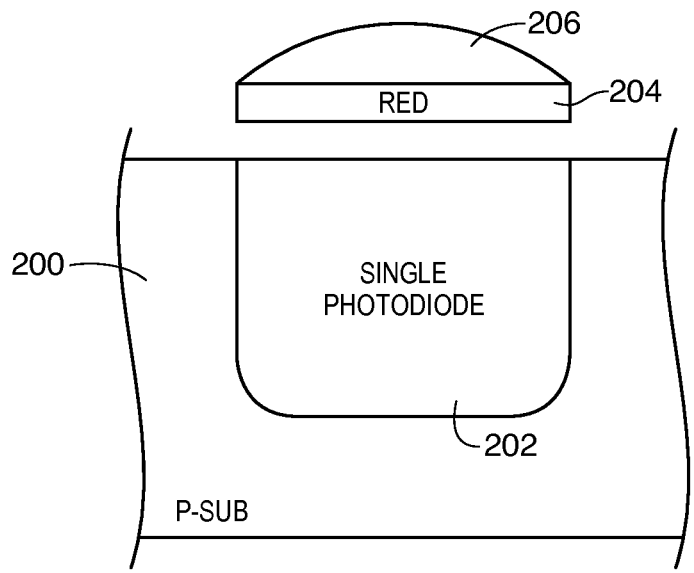
FIG. 2 is a diagram of a conventional image pixel with a single photodiode.

FIG. 2 is a diagram of a conventional pixel that includes only one photodiode. As shown in FIG. 2, a single photodiode 202 is formed in a p-type silicon substrate 200. A red color filter 204 can be formed over photodiode 202, and a microlens 206 can be formed over the red color filter 204. Consider, for example, that photodiode 202 has a pixel capacity N.

Figure 3:
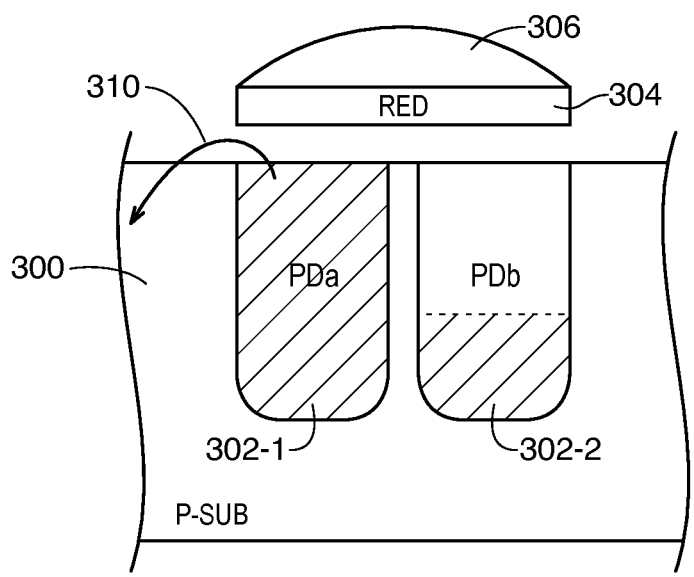
FIG. 3 is a diagram of a conventional image pixel with two photodiodes.

In an effort to enable focus detection (or depth sensing) on image sensors, image pixels have been developed that include dual photodiodes. FIG. 3 is a diagram of a conventional dual photodiode pixel. As shown in FIG. 3, a first photodiode 302-1 and a second photodiode 302-2 are formed in p-type silicon substrate 300. A red color filter 304 can be formed over the two photodiodes 302-1 and 302-2, and a microlens 306 can be formed over the red color filter 304.

Assuming that the pixel dimensions for the single-photodiode implementation of FIG. 2 and that the pixel dimensions for the dual-photodiode implementation of FIG. 3 are the same, each of the dual photodiodes will therefore have a pixel capacity of N/2. During focus sensing operations, signals can be read out independently from each of the two photodiodes. If the signal levels from the two photodiodes are substantially equal, then the light is in focus. If the signal levels from the two photodiodes are substantially mismatched, then the light is out of focus. This is because when the light is out of focus, charge will be predominately accumulating in one of the two photodiodes.

In the example of FIG. 3, the first photodiode 302-1 reaches its full capacity and becomes saturated, whereas the second photodiode 302-2 is only partially filled and is not saturated. This scenario may be problematic during normal pixel operation in which the signals from the two photodiodes are combined to generate a final output signal. When the amount of charge is predominately concentrated in one of the two photodiodes, the combined signal becomes meaningless as the combined signal is no longer proportional to the amount of incoming light. Thus, for extreme out-of-focus conditions where the amount of charge being accumulated in the two photodiodes are substantially different, the total pixel capacity effectively becomes N/2. Moreover, when a photodiode is saturated, any additional charge can inadvertently leak to adjacent pixels (as indicated by arrow 310), further degrading image quality.

Figure 4:
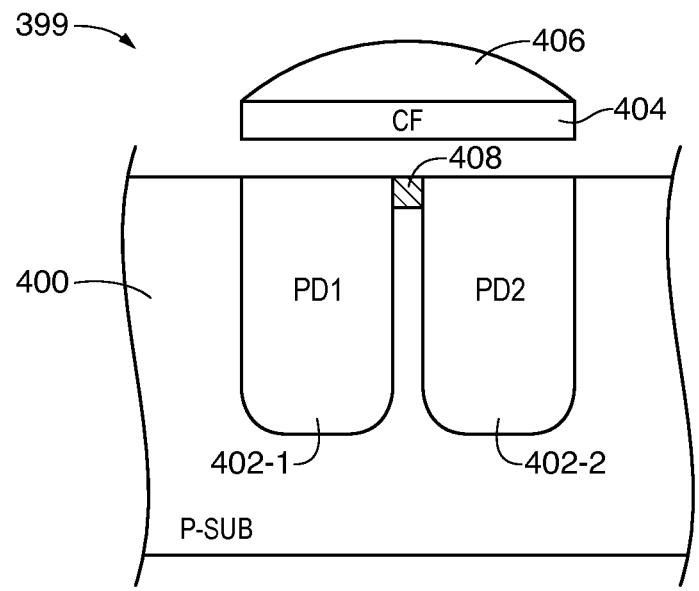
FIG. 4 is a cross-sectional side view of an illustrative image sensor pixel having multiple photodiodes and at least one preferential blooming channel in accordance with an embodiment.

In accordance with an embodiment, an improved image sensor pixel having at least two photodiodes linked together via a preferential spillage or "blooming" path may be provided. FIG. 4 is a cross-sectional side view of an illustrative image sensor pixel 399 having multiple photodiodes and a preferential blooming path (sometimes referred to as blooming channel) interposed between the photodiodes. As shown in FIG. 4, pixel 399 may include a first photodiode 402-1 and a second photodiode 402-2 formed in a semiconductor substrate 400 (e.g., a p-type semiconductor substrate), a color filter structure 404 formed over photodiodes 402-1 and 402-2, a microlens formed over color filter structure 404, and a blooming channel such as blooming channel 408 formed at the surface of substrate 400 between photodiodes 402-1 and 402-2. Color filter structure 404 may be a red color filter for passing through only red light, a green color filter for passing through only green light, a blue color filter for passing through only blue light, a cyan color filter, a magenta color filter, a yellow color filter, a clear filter, and/or other suitable types of color filter.

Figure 5:
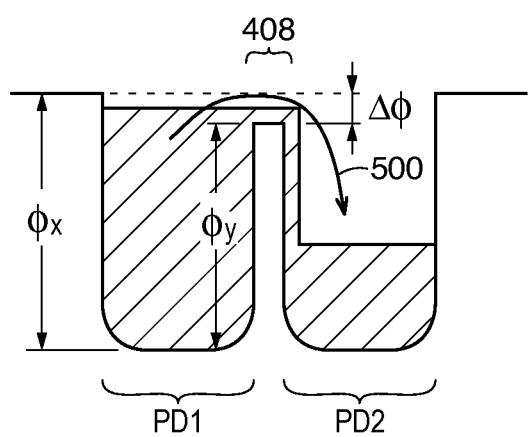
FIG. 5 is a diagram illustrating how charge can flow from one photodiode to another via a preferential blooming channel in accordance with an embodiment.

Blooming channel 408 may serve to provide a reduced potential barrier between the pair of photodiodes so that when one photodiode fills to capacity, any additional charge (e.g., electrons) will spill over to the other photodiode rather than being lost to some other unintended structure(s) in the pixel array. This scenario is illustrated in the potential diagram of FIG. 5. As shown in FIG. 5, a potential barrier Φx may exist between the photodiodes 402 within a given pixel 399 and other photodiodes of neighboring pixels in the immediate vicinity. Blooming path 408, however, provides a reduced potential barrier Φy between the two photodiodes 402 within the given pixel 399.

As described above, this difference in potential (i.e., ΔΦ) can allow excess charge to overflow from one photodiode to another within a given multi-diode pixel. In general, ΔΦ should be designed to be as small as possible while still enabling overflowing electrons to preferentially flow between intra-pixel photodiodes rather than to adjacent pixels (e.g., the preferential blooming channel should be configured such that intra-pixel leakage occurs between photodiodes within a pixel if one of the photodiodes were to saturate while minimizing the chance for inter-pixel leakage). In the example of FIG. 5, once first photodiode PD1 is saturated, any new signal will fall into second photodiode PD2 via intra-pixel blooming channel 408 (as indicated by arrow 500), and the total accumulated charge in PD1 and PD2 will be proportional to the incoming light signal until both photodiodes PD1 and PD2 become saturated. As a result, the charge capacity of pixel 399 is effectively increased back to approximately N (assuming the capacity for each of PD1 and PD2 is N/2). Pixel 399 implemented in this way can therefore provide both focus detection (or depth sensing or phase detection) and improved dynamic range compared to conventional dual photodiode pixels (of FIG. 3), thereby improving image quality.

Figure 6:
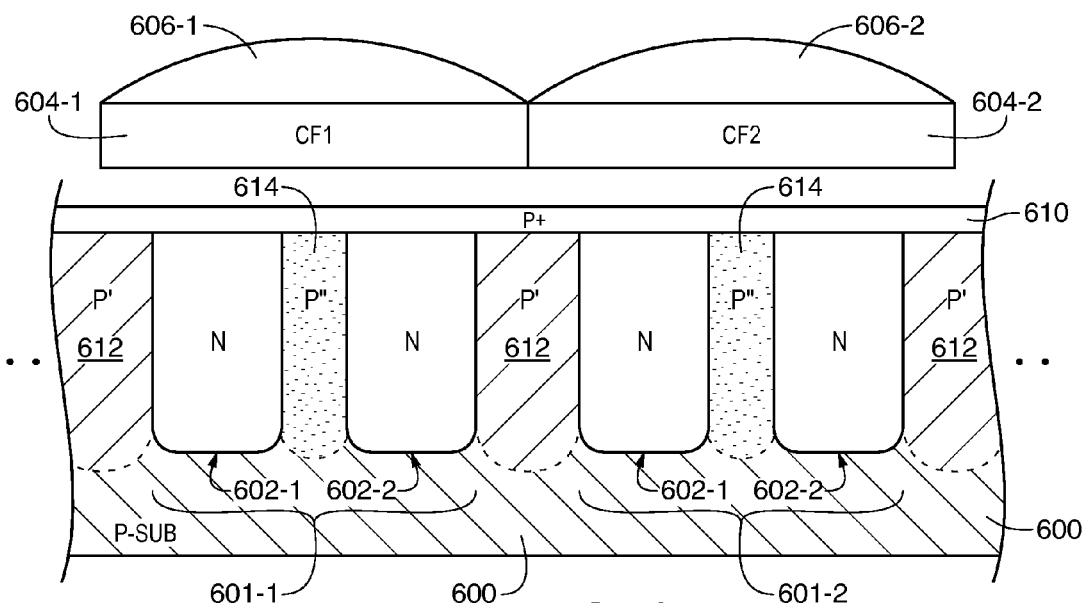
FIG. 6 is a cross-sectional side view of an illustrative image sensor array showing how preferential blooming channels can be implemented in accordance with an embodiment.

FIG. 6 is a cross-sectional side view of an illustrative image sensor array showing how preferential blooming channels can be formed on a substrate (e.g., a P-type substrate). As shown in FIG. 6, a first pixel 601-1 and a second pixel 601-2 may be formed in a semiconductor substrate 600. A first color filter structure 604-1 may be formed over first pixel 601-1, whereas a second color filter structure 604-2 may be formed over second pixel 601-2. A first microlens 606-1 may be formed over first color filter structure 604-1, whereas a second microlens 606-2 may be formed over second color filter structure 604-2.

A P+ layer 610 may be formed at the surface of substrate 600. P' doped regions 612 may be formed between adjacent pixels 601 (e.g., regions between adjacent pixels may have a P' doping that provides inter-pixel potential barrier Φx as shown in FIG. 5). A first set of N-type regions may be formed under layer 610 to form photodiodes 602-1 and 602-2 within pixel 601-1. A second set of N-type regions may be formed under layer 610 to form photodiodes 602-1 and 602-2 within pixel 601-2. The first and second sets of N-type regions are generally formed at the same time during fabrication of the image sensor but can optionally be formed separately, if desired. A P'' doped region 614 may be formed between the N-type regions within each pixel 601 (e.g., the region between photodiodes 602-1 and 602-2 with a particular pixel may exhibit a P''' doping that provides the lowered intra-pixel potential barrier Φy described in connection with FIG. 5), thereby acting as the preferential blooming channel. The doping concentration of the P''' region should be less than that of the P' region to realize the preferential blooming path. In general, the intra-pixel blooming channel region 614 can be formed with any shape or pattern and can extend into the surface of substrate 600 to any suitable depth.

Figure 7:
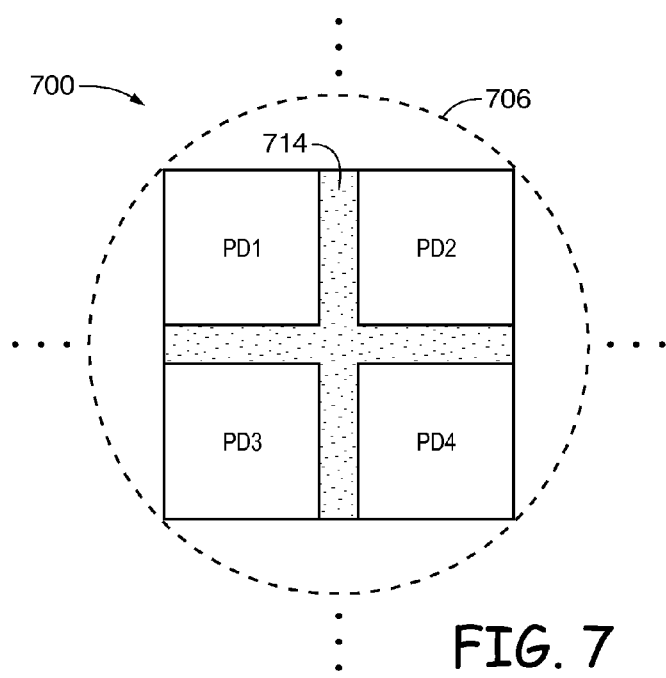
FIG. 7 is a top layout view illustrating how preferential blooming channels can be formed among an array of photodiodes in accordance with an embodiment.

The example described in connection with FIGS. 4-6 in which a dual photodiode pixel is provided with a preferential blooming channel is merely illustrative and does not serve to limit the scope of the present invention. FIG. 7 shows a top layout view of a pixel arrangement in which preferential blooming channel region 714 can be formed among a single pixel 700 having four associated photodiodes (e.g., PD1, PD2, PD3, and PD4). A single microlens such as microlens 706 may be formed over the four photodiodes. Blooming channel region 714 may be implemented using a reduced P''' doping so that excess charge can flow from one saturated photodiode to another with pixel 700.

The "+" shape of the blooming channel region 714 is also merely illustrative. The blooming channel region can have any suitable shape as long as the N-type regions within a pixel are electrically connected to one another. In general, the use of preferential blooming channel(s) within a pixel can be applied to any type of multi-photodiode pixels (e.g., image sensor pixels with more than two photodiodes, more than four photodiodes, an N×N array of photodiodes, an N×M array of photodiodes, etc.).

Figure 8:
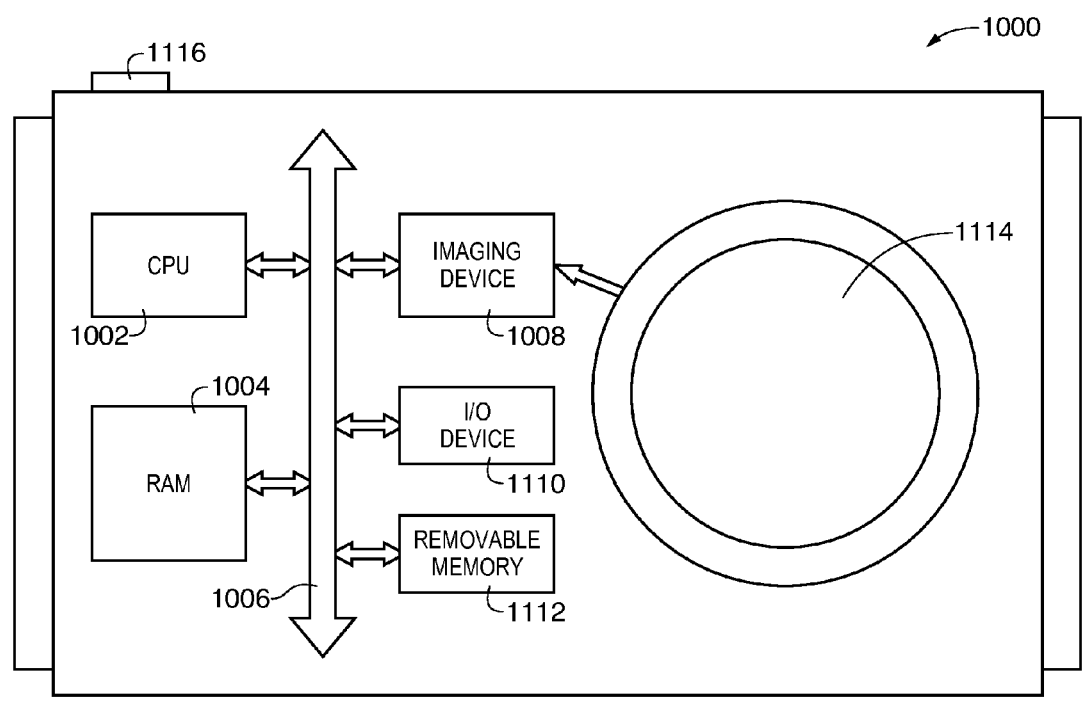
FIG. 8 is a block diagram of a processor system that may employ some of the embodiments of FIGS. 4-7 in accordance with an embodiment of the present invention.

FIG. 8 is a simplified diagram of an illustrative processor system 1000, such as a digital camera, which includes an imaging device 1008 (e.g., the camera module of FIG. 1) employing an imager having pixels with multiple diodes joined together using preferential blooming path regions. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating imaging systems with an image sensor module. The image sensor module may include an array of image sensor pixels and one or more lenses that focus light onto the array of image sensor pixels (e.g., image pixels arranged in rows and columns).

In accordance with an embodiment, an image sensor pixel may include a first photodiode formed in a semiconductor substrate, a second photodiode formed in the substrate, and a preferential blooming channel interposed between the first and second photodiodes in the substrate. The pixel may include a color filter that is formed directly over the first and second photodiodes and a microlens that is formed over the color filter (e.g., the color filter and the microlens may be optically centered with respect to the two associated photodiodes).

In particular, the blooming channel may serve as a path that provides a reduced potential barrier through which excess charge can flow between the first photodiode and the second photodiode. For example, when charge is saturated in the first photodiode, any additional charge that is generated at the first photodiode can flow to the second photodiode via the blooming path. Similarly, when charge is saturated in the second photodiode, any excess charge that is generated at the second photodiode can flow to the first photodiode via the blooming path. Charge accumulated from the first and second photodiodes in this way can be combined during normal pixel operation without suffering from reduced pixel capacity or can be individually read out and compared to enable depth sensing capabilities.

Each pixel may be surrounded by a region in the substrate having a first doping concentration. In general, the blooming channel may exhibit a second doping concentration that is less than the first doping concentration to realize the reduced potential barrier linking the first and second photodiodes. In one suitable embodiment, the region surrounding each pixel and that blooming channel may be P-type while charge can be accumulated in N-type doping regions within the photodiodes. If desired, the doping types described herein can be swapped without loss of generality.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
    a substrate;
    a first photodiode that is formed in the substrate and that generates charge in response to incident light;
    a second photodiode formed in the substrate, wherein the first and second photodiodes are formed laterally with respect to each other along a surface of the substrate; and
    a preferential blooming channel interposed between the first and second photodiodes in the substrate that reduces a potential barrier between the first and second photodiodes, wherein some of the charge flows directly into the second photodiode via the preferential blooming channel.

2. The image sensor pixel defined in claim 1, further comprising:

a color filter that is optically centered with respect to the first and second photodiodes.

3. The image sensor pixel defined in claim 1, further comprising:
a microlens that overlaps with the first and second photodiodes.

4. The image sensor pixel defined in claim 1, further comprising:
a first region in the substrate having a first doping concentration that surrounds the first and second photodiodes, wherein the preferential blooming channel comprises a second region in the substrate having a second doping concentration that is less than the first doping concentration.

5. The image sensor pixel defined in claim 4, wherein the first and second regions comprise P-type doping regions, and wherein the first and second photodiodes include N-type doping regions in which charge accumulates.

6. The image sensor pixel defined in claim 4, wherein the first and second regions comprise N-type doping regions, and wherein the first and second photodiodes include P-type doping regions in which charge accumulates.

7. The image sensor pixel defined in claim 1, further comprising:
a third photodiode formed in the substrate, wherein the preferential blooming channel is also configured to allow charge to flow from the third photodiode to at least one of the first and second photodiodes.

8. A method of operating an image pixel, comprising:
with a first photodiode formed at a surface of a substrate, accumulating charge in response to incident light;
with a second photodiode formed at the surface of the substrate accumulating charge in response to the incident light, wherein the first and second photodiodes are formed laterally with respect to each other along the surface of the substrate;
with a microlens formed parallel to the surface of the substrate, directing the incident light towards the first and second photodiodes;
in response to charge being saturated in the first photodiode while the second photodiode has yet to be saturated, allowing additional charge that is generated at the first photodiode to flow from the first photodiode to the second photodiode via a preferential blooming path; and
in response to charge being saturated in the second photodiode while the first photodiode has yet to be saturated, allowing additional charge that is generated at the second photodiode to flow from the second photodiode to the first photodiode via the preferential blooming path.

9. The method defined in claim 8, further comprising:
reading a first signal from the first photodiode;
reading a second signal from the second photodiode; and
performing depth sensing by comparing the first and second signals.

10. The method defined in claim 8, further comprising:
reading a first signal from the first photodiode;
reading a second signal from the second photodiode; and
combining the first and second signals even when one of the first and second photodiodes is saturated.

11. The method defined in claim 8, wherein the image pixel further includes a first region in the substrate having a first doping concentration that surrounds the first and second photodiodes, and wherein the preferential blooming path comprises a second region in the substrate having a second doping concentration that is less than the first doping concentration.

12. The method defined in claim 8, further comprising:
accumulating charge in a third photodiode in the image pixel; and
in response to charge being saturated in the third photodiode, allowing excess charge that is generated in the third photodiode to flow from the third photodiode to at least one of the first and second photodiodes via the preferential blooming path.

13. The method defined in claim 12, further comprising:
accumulating charge in a fourth photodiode in the image pixel; and
in response to charge being saturated in the fourth photodiode, allowing excess charge that is generated in the fourth photodiode to flow from the fourth photodiode to at least one of the first, second, and third photodiodes via the preferential blooming path.

14. The method defined in claim 13, further comprising:
using the microlens, directing incident light towards the third and fourth photodiodes.

15. A system, comprising:
a central processing unit;
memory;
a lens;
input-output circuitry; and
an imaging device, wherein the imaging device comprises:
an array of pixels formed in a substrate, each of which includes first and second photosensitive elements and a blooming channel that provides a reduced potential barrier through which charge can flow directly between the first photosensitive element and the second photosensitive element during normal operation of the imaging device, wherein the first and second photosensitive elements are formed laterally with respect to each other along a surface of the substrate; and
a microlens formed parallel to the surface of the substrate.

16. The system defined in claim 15, wherein the blooming channel is further configured to allow charge to flow from the first photosensitive element to the second photosensitive only when the first photosensitive element is saturated.

17. The system defined in claim 15, wherein the imaging device further comprises:
a color filter formed over the first and second photosensitive elements.

18. The system defined in claim 15, wherein the imaging device further comprises:
a first region having a first doping concentration that separates adjacent pixels in the array of pixels, wherein the blooming channel exhibits a second doping concentration that is less than the first doping concentration.

19. The system defined in claim 15, wherein each pixel includes at least four photosensitive elements that are linked together via the blooming channel.

* * * * *